United States Patent
Jeong et al.

(10) Patent No.: US 9,830,956 B2
(45) Date of Patent: Nov. 28, 2017

(54) LATCH CIRCUIT AND SEMICONDUCTOR APPARATUS INCLUDING THE SAME

(71) Applicant: SK hynix Inc., Icheon-si Gyeonggi-do (KR)

(72) Inventors: Chun Seok Jeong, Icheon-si (KR); Hyun Sung Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/152,800

(22) Filed: May 12, 2016

(65) Prior Publication Data

US 2017/0194038 A1    Jul. 6, 2017

(30) Foreign Application Priority Data

Dec. 30, 2015    (KR) .................. 10-2015-0190243

(51) Int. Cl.
*G11C 7/10*      (2006.01)
*H01L 25/065*    (2006.01)

(52) U.S. Cl.
CPC ............ *G11C 7/10* (2013.01); *H01L 25/0657* (2013.01); *H01L 2224/13025* (2013.01); *H01L 2224/16146* (2013.01); *H01L 2224/16227* (2013.01); *H01L 2224/17181* (2013.01); *H01L 2225/06541* (2013.01); *H01L 2924/15192* (2013.01); *H01L 2924/15311* (2013.01)

(58) Field of Classification Search
CPC ....... G11C 7/106; G11C 7/065; G11C 7/1039; G11C 7/1087

USPC ................ 365/189.05, 230.08, 220
See application file for complete search history.

(56) References Cited

U.S. PATENT DOCUMENTS

| | | | | |
|---|---|---|---|---|
| 2004/0095178 A1* | 5/2004 | Bang | ...................... | G11C 7/103 327/215 |
| 2006/0133158 A1* | 6/2006 | Shin | ...................... | G11C 7/103 365/189.05 |
| 2010/0302873 A1* | 12/2010 | Lee | ...................... | G11C 7/1045 365/189.05 |
| 2011/0292708 A1* | 12/2011 | Kang | ...................... | H01L 24/17 365/63 |
| 2015/0098283 A1* | 4/2015 | Ku | ...................... | G11C 7/1039 365/193 |

FOREIGN PATENT DOCUMENTS

KR    1020110001416 A    1/2011

* cited by examiner

*Primary Examiner* — Han Yang
(74) *Attorney, Agent, or Firm* — William Park & Associates Ltd.

(57) ABSTRACT

A latch circuit may be provided. The latch circuit may include a plurality of latches configured to store and output data through input/output signal lines according to input/output control signals. Latches coupled with input/output signal lines of same orders among the plurality of latches may be disposed by being distributed by orders of the input/output control signals. A plurality of pipe latches may be configured by latches which are inputted with input/output control signals of same orders, among the latches disposed by being distributed.

16 Claims, 8 Drawing Sheets

LATCH CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2015-0190243, filed on Dec. 30, 2015, in the Korean Intellectual Property Office, which is incorporated herein by reference in its entirety.

BACKGROUND

1. Technical Field

Various embodiments generally relate to a semiconductor circuit, and, more particularly, to a latch circuit and a semiconductor apparatus including the same.

2. Related Art

To increase a data input/output speed of a semiconductor apparatus, developments are being pursued in the direction of increasing the number of input/output lines for the semiconductor apparatus.

Since the number of input/output terminals also increases according to an increase in the number of input/output lines, storage circuits for temporarily storing data in a data input/output process, for example, pipe latches, should be increased as well to correspond to the number of input/output terminals.

Therefore, problems are likely to arise when disposing pipe latches and signal lines for the pipe latches within a limited area.

SUMMARY

In an embodiment, a latch circuit may be provided. The latch circuit may include a plurality of latches configured to store and output data through input/output signal lines according to input/output control signals. Latches coupled with input/output signal lines of same orders among the plurality of latches may be disposed by being distributed by orders of the input/output control signals. A plurality of pipe latches may be configured by latches which are inputted with input/output control signals of same orders, among the latches disposed by being distributed.

In an embodiment, a latch circuit may be provided. The latch circuit may include a plurality of latches configured to store and output data through input/output signal lines according to input/output control signals. Latches coupled with input/output signal lines of same orders among the plurality of latches may be disposed by being distributed according to first orders of the input/output control signals and being identified according to a second order of the input/output control signals. A plurality of pipe latches may be configured by latches which are inputted with input/output control signals of same orders, among the latches disposed by being distributed.

In an embodiment, a semiconductor apparatus may be provided. The semiconductor apparatus may include a semiconductor memory in which a plurality of memory chips may be stacked, at least one among the memory chips including a through electrode region where a plurality of through electrodes may be disposed. A latch circuit may be disposed in the through electrode region. In the latch circuit, among a plurality of latches which may be configured to store and output data through input/output signal lines according to input/output control signals, latches coupled with input/output signal lines of same orders may be disposed by being distributed by orders of the input/output control signals.

DETAILED DESCRIPTION

Various embodiments may be directed to a latch circuit capable of efficient disposition of pipe latches and corresponding signal lines, and a semiconductor apparatus including the same.

Hereinafter, a latch circuit and a semiconductor apparatus including the same may be described below with reference to the accompanying drawings through various examples of embodiments.

A semiconductor apparatus 100 in accordance with an embodiment may be realized in a type such as a system-in-package, a multi-chip package and a system-on-chip, and may also be realized in a type such as a package-on-package which includes a plurality of packages.

Figure 1:
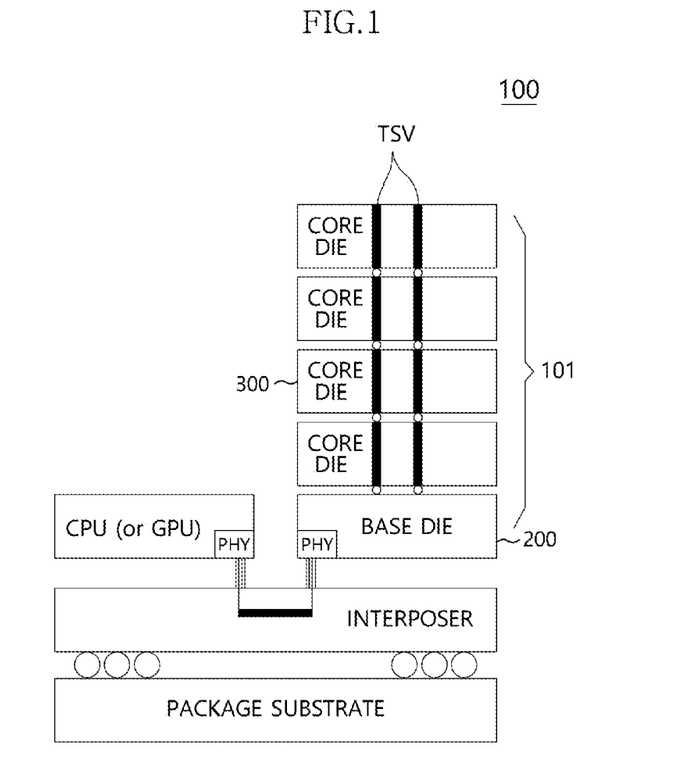
FIG. 1 is a diagram illustrating a representation of an example of the configuration of a semiconductor apparatus in accordance with an embodiment.

Referring to FIG. 1, the semiconductor apparatus 100 in accordance with an embodiment may include a stack type semiconductor memory 101, a memory controller CPU (or GPU), an interposer, and a package substrate.

The stack type semiconductor memory 101 may be configured in the type of an HBM (high bandwidth memory) in which a plurality of memory chips, for example, a plurality of dies are stacked and are electrically coupled through through electrodes to increase the number of input/output units and thereby increase a bandwidth.

The interposer may be coupled over the package substrate.

The stack type semiconductor memory 101 and the memory controller CPU (or GPU) may be coupled over the interposer.

Respective physical layers PHY of the stack type semiconductor memory 101 and the memory controller CPU (or GPU) may be coupled through the interposer.

The stack type semiconductor memory 101 may be configured as a plurality of dies which may be stacked.

The plurality of dies may include a base die 200 and a plurality of core dies 300.

The base die 200 and the plurality of core dies 300 may be electrically coupled through through electrodes, for example, TSV (through-silicon vias).

Figure 2:
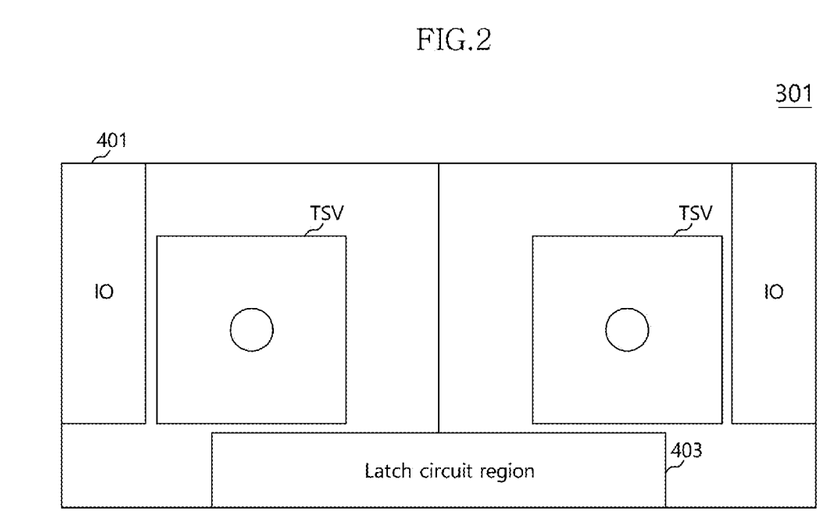
FIG. 2 is a diagram illustrating a representation of an example of a through electrode region of a core die illustrated in FIG. 1.

Referring to FIG. 2, each core die 300 of FIG. 1 may include a through electrode region 301 where through electrodes TSV are disposed.

Besides the through electrodes TSV, the through electrode region 301 may include input/output circuit regions (JO) 401 and a latch circuit region 403.

The through electrodes TSV may be coupled with data input/output terminals (DQ) (not illustrated).

The latch circuit region 403 as a configuration for storing input/output data may be disposed in an extra space of the through electrode region 301.

Figure 3:
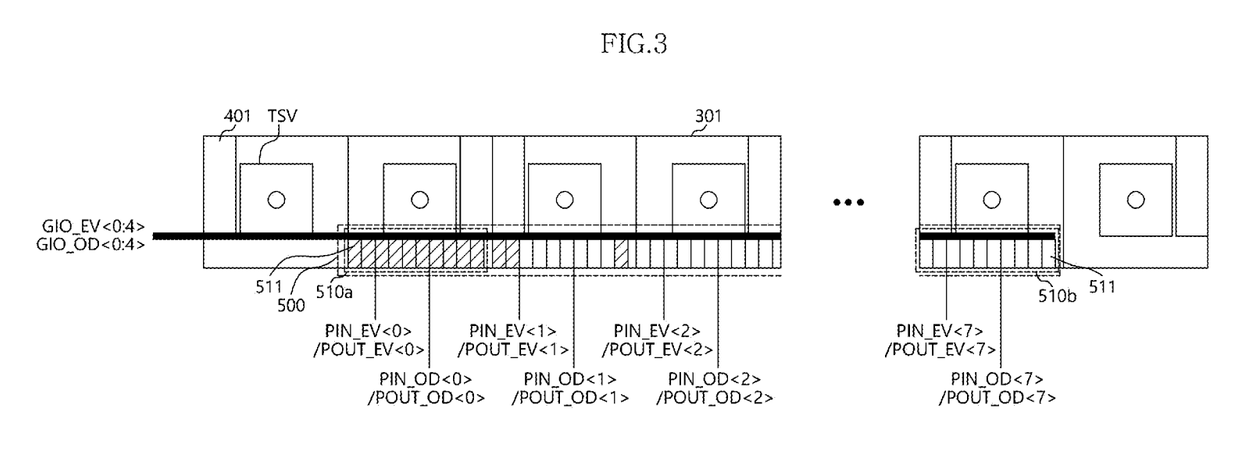
FIG. 3 is a diagram illustrating a representation of an example of a layout scheme of a latch circuit in accordance with an embodiment.

Referring to FIGS. 2 and 3, a latch circuit 500 in accordance with an embodiment may be disposed in the latch circuit region 403 in the through electrode region 301.

The latch circuit 500 may be coupled with input/output signal lines GIO_EV<0:4> and GIO_OD<0:4>.

The latch circuit 500 may be inputted with and store or output data through the input/output signal lines GIO_EV<0:4> and GIO_OD<0:4> according to input/output control signals PIN_EV<0:7>, PIN_OD<0:7>, POUT_EV<0:7> and POUT_OD<0:7>.

The latch circuit 500 may store data transmitted through the input/output signal lines GIO_EV<0:4> and GIO_OD<0:4>, according to the input control signals PIN_EV<0:7> and PIN_OD<0:7>.

The latch circuit 500 may transmit stored data to the input/output circuit regions 401, according to the output control signals POUT_EV<0:7> and POUT_OD<0:7>.

The data transmitted to the input/output circuit regions 401 may be outputted to an exterior of the core die 300 through the through electrodes TSV.

The latch circuit 500 may include a plurality of latches 511.

The plurality of latches 511 may be disposed in such a manner that latches coupled with input/output signal lines of the same orders among the input/output signal lines GIO_EV<0:4> and GIO_OD<0:4> are distributed by the orders of the input/output control signals PIN_EV<0:7>, PIN_OD<0:7>, POUT_EV<0:7> and POUT_OD<0:7>.

Among the plurality of latches 511 which are disposed by being distributed in this way, latches 511 which are inputted with input/output control signals of the same orders among the input/output control signals PIN_EV<0:7>, PIN_OD<0:7>, POUT_EV<0:7> and POUT_OD<0:7> may configure pipe latches 510a and 510b, which will be described below with reference to FIG. 4.

Although the pipe latches 510a and 510b are identified for the sake of convenience in explanation since they have different input signals, it is to be noted that the pipe latches 510a and 510b may be configured in the same way.

Figure 4:
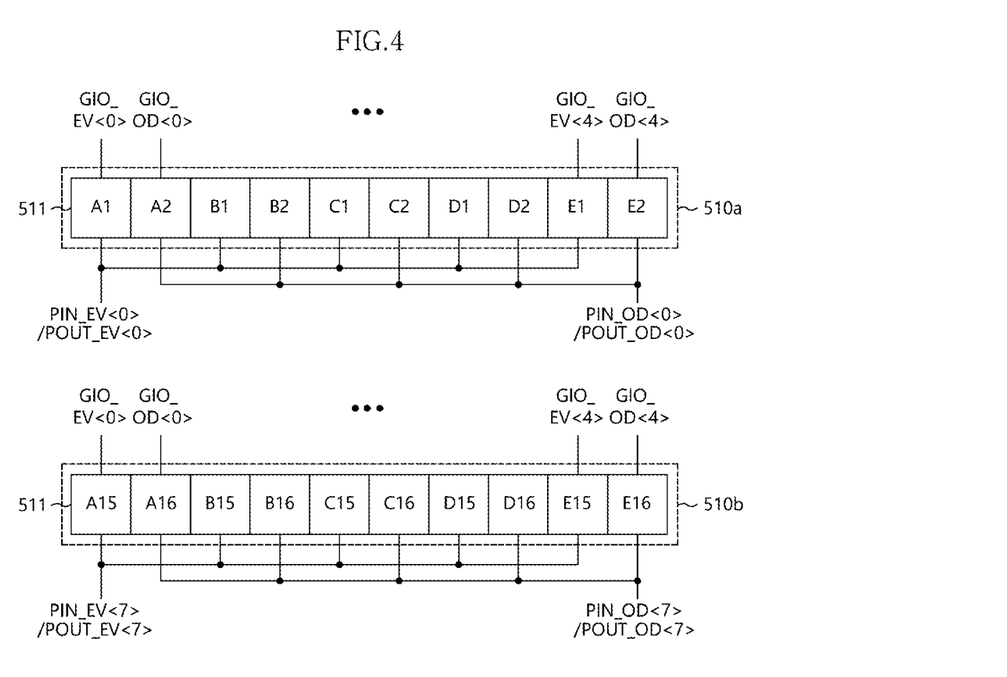
FIG. 4 is a diagram illustrating a representation of an example of the configurations of pipe latches illustrated in FIG. 3.

Referring to FIG. 4, the pipe latch 510a may include, for example, 10 latches 511, in correspondence to the input/output signal lines GIO_EV<0:4> and GIO_OD<0:4>.

The latches 511 of the pipe latch 510a may be identified by symbols A1, A2, . . . , E1 and E2, and, while not illustrated, the latches of a pipe latch on the right side of the pipe latch 510a may be identified by symbols A3, A4, . . . , E3 and E4. In this way, the latches of the rightmost pipe latch 510b (i.e. see also FIG. 3) may be identified by symbols A15, A16, . . . , E15 and E16.

In the respective pipe latches, latches 511 given with the same alphabets may be coupled with input/output signal lines of the same orders among the input/output signal lines GIO_EV<0>/GIO_OD<0> to GIO_EV<4>/GIO_OD<4>, and latches 511 given with different alphabets may be coupled with input/output signal lines of different orders among the input/output signal lines GIO_EV<0>/GIO_OD<0> to GIO_EV<4>/GIO_OD<4>.

For example, the input/output signal line GIO_EV<0> may be coupled to the latches A1, A3, A5, . . . and A15, and the input/output signal line GIO_OD<0> may be coupled to the latches A2, A4, A6 . . . and A16.

Also, the input/output signal line GIO_EV<4> may be coupled to the latches E1, E3, E5, . . . and E15, and the input/output signal line GIO_OD<4> may be coupled to the latches E2, E4, E6 . . . and E16.

The input/output control signals PIN_EV<0>, PIN_OD<0>, POUT_EV<0> and POUT_OD<0> of the same order may be inputted to the latches A1, A2, . . . , E1 and E2 of the pipe latch 510a. in an embodiment, for example, input control signals PIN_EV<0> may be inputted to latches A1, B1, C1, D1, E1, PIN_EV<1> may be inputted to latches A3, B3, C3, D3, E3, . . . PIN_EV<7> may be inputted to latches A15, B15, C15, D15, E15. In an embodiment, for example, input control signals PIN_OD<0> may be inputted to latches A2, B2, C2, D2, E2, PIN_OD<1> may be inputted to latches A4, B4, C4, D4, E4 . . . PIN OD<7> may be inputted to latches A16, B16, C16, D16, E16. In an embodiment, for example, the output control signals POUT_EV<0> may be outputted from latches A1, B1, C1, D1, E1, POUT_EV<1> may be outputted from latches A3, B3, C3, D3, E3, . . . POUT_EV<7> may be outputted from latches A15, B15, C15, D15, E15. In an embodiment, for example, the output control signals POUT_OD<0> may be outputted from latches A2, B2, C2, D2, E2, POUT_OD<1> may be outputted from latches A4, B4, C4, D4, E4 . . . POUT OD<7> may be outputted from latches A16, B16, C16, D16, E16.

The input/output control signals PIN_EV<7>, PIN_OD<7>, POUT_EV<7> and POUT_OD<7> of the same order may be inputted to the latches A15, A16, . . . , E15 and E16 of the pipe latch 510b.

As described above, the pipe latches 510a and 510b may be configured in such a manner that latches 511 coupled with input/output signal lines of the same orders are disposed by being distributed and latches 511 to be inputted with input/output control signals of the same orders among the latches 511 disposed by being distributed are grouped together.

Figure 5:
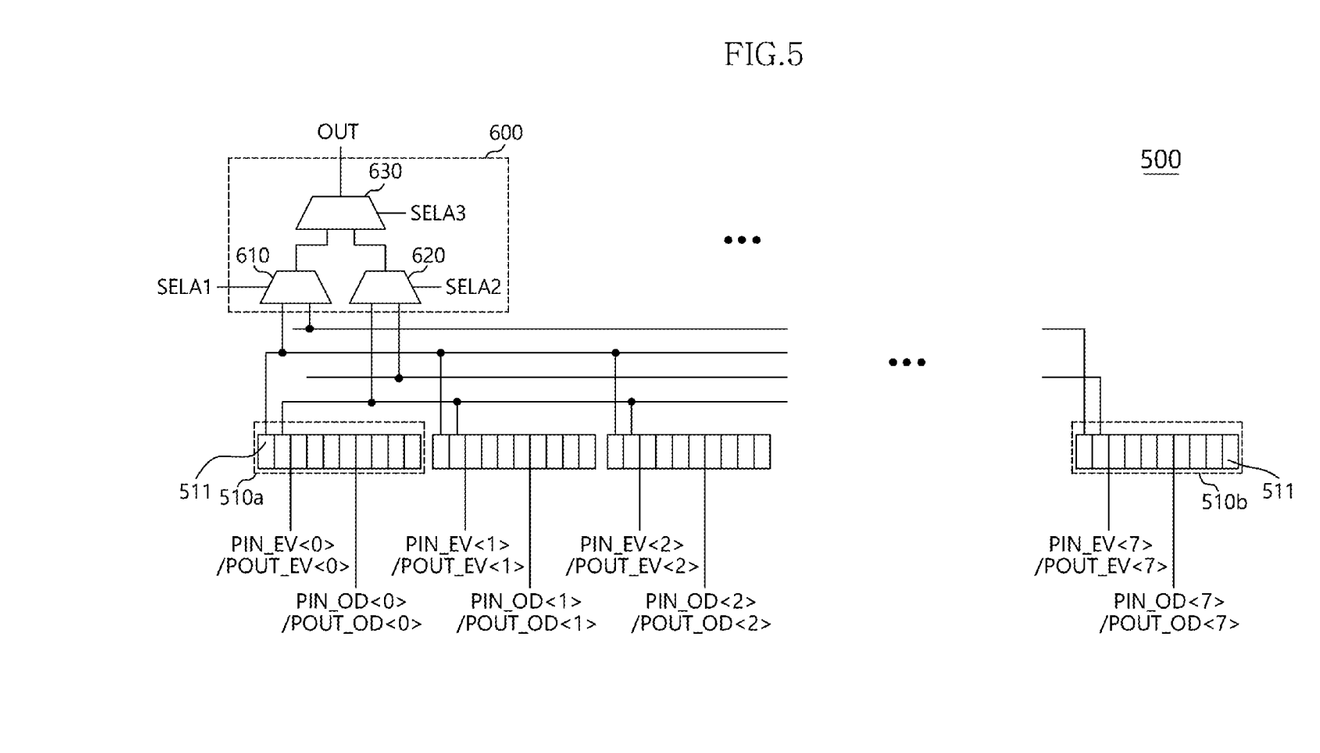
FIG. 5 is a diagram illustrating a representation of an example of the configuration of the latch circuit in accordance with an embodiment.

Referring to FIG. 5, the latch circuit 500 may include a plurality of pipe latches 510a, . . . and 510b and output selection blocks 600.

The plurality of pipe latches 510a, . . . and 510b may store data transmitted through the input/output signal lines GIO_EV<0>/GIO_OD<0> to GIO_EV<4>/GIO_OD<4>, according to the input control signals PIN_EV<0:7> and PIN_OD<0:7>.

The plurality of pipe latches 510a, . . . and 510b may output stored data according to the output control signals POUT_EV<0:7> and POUT_OD<0:7> which are enabled in conformity with predetermined timings.

Each output selection block 600 may generate an output signal OUT by selecting data outputted from the plurality of pipe latches 510a, . . . and 510b, according to first to third selection control signals SELA1 to SELA3.

The output selection block 600 may primarily multiplex data outputted from the plurality of pipe latches 510a, . . . and 510b, according to first orders (<0:3> or <4:7>) of the output control signals POUT_EV<0:7> and POUT_OD<0: 7>, and output resultant data, and may secondarily multiplex primarily multiplexed data according to a second order (even/odd) of the output control signals POUT_EV<0:7> and POUT_OD<0:7> and output resultant data.

The output selection block 600 of FIG. 5 is illustrated as only a component for processing output data of the latches A1 to A16 coupled with the input/output signal lines GIO_EV<0> and GIO_OD<0> of the same order among the latches 511 of the plurality of pipe latches 510a, . . . and 510b, and components for processing output data of the remaining latches B1 to B16, C1 to C16, D1 to D16 and E1 to E16 may be configured in the same way as the output selection block 600.

The output selection block 600 may include a first multiplexer 610 to a third multiplexer 630.

The first multiplexer 610 may select and output, according to the first selection control signal SELA1, one among output data of the latches A1, A3, A5 and A7 from which data are outputted according to the output control signals POUT_EV<0:3> and output data of the latches A9, A11, A13 and A15 from which data are outputted according to the output control signals POUT_EV<4:7>.

The second multiplexer 620 may select and output, according to the second selection control signal SELA2, one among output data of the latches A2, A4, A6 and A8 from which data are outputted according to the output control signals POUT_OD<0:3> and output data of the latches A10, A12, A14 and A16 from which data are outputted according to the output control signals POUT_OD<4:7>.

The third multiplexer 630 may generate the output signal OUT by selecting one between the output signal of the first multiplexer 610 and the output signal of the second multiplexer 620 according to the third selection control signal SELA3.

The first to third selection control signals SELA1 to SELA3 may be generated based on the output control signals POUT_EV<0:7> and POUT_OD<0:7>.

For example, the first selection control signal SELA1 may be generated using one or more among the even output control signals POUT_EV<0:7>, for example, the even output control signals POUT_EV<0:3> or POUT_EV<4:7>.

The second selection control signal SELA2 may be generated using one or more among the odd output control signals POUT_OD<0:7>, for example, the odd output control signals POUT_OD<0:3> or POUT_OD<4:7>.

The third selection control signal SELA3 may be generated according to one or more among the output control signals POUT_EV<0:7> or one or more among the output control signals POUT_OD<0:7>.

Figure 6:
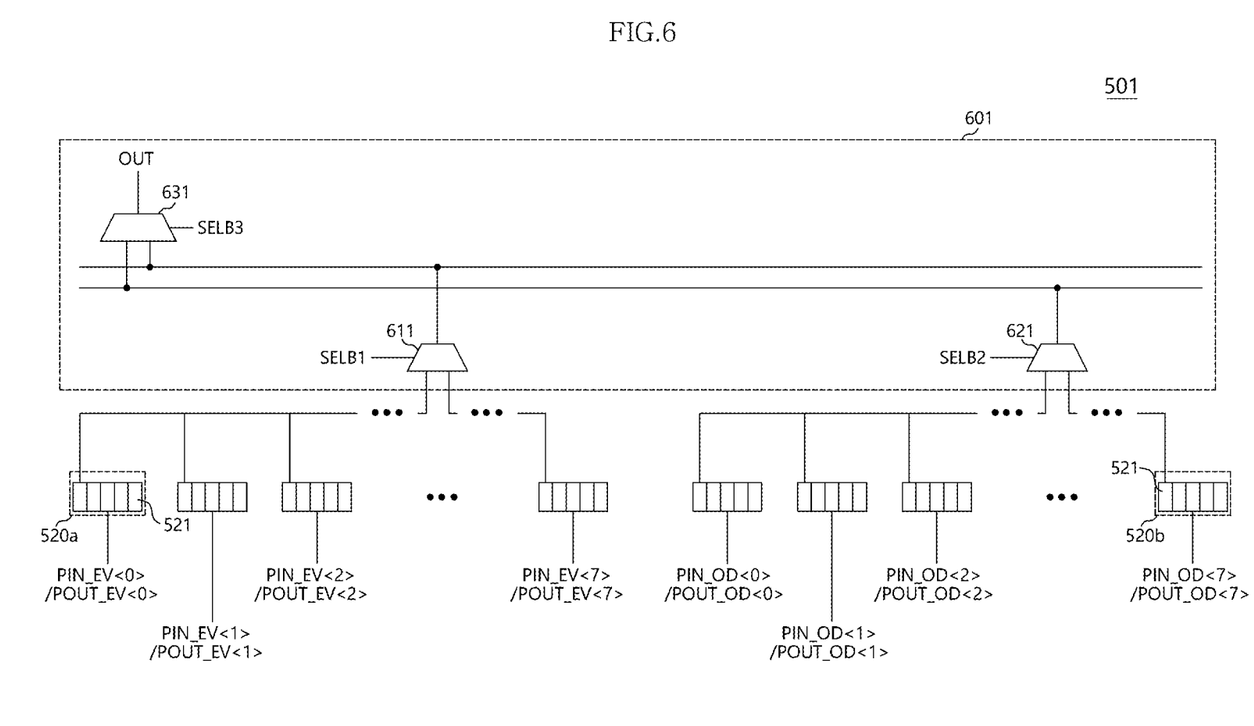
FIG. 6 is a diagram illustrating a representation of an example of the configuration of a latch circuit in accordance with an embodiment.

Referring to FIG. 6, a latch circuit 501 in accordance with an embodiment may include a plurality of pipe latches 520a, . . . and 520b and an output selection block 601.

The plurality of pipe latches 520a, . . . and 520b may store data transmitted through the input/output signal lines GIO_EV<0>/GIO_OD<0> to GIO_EV<4>/GIO_OD<4>, according to the input control signals PIN_EV<0:7> and PIN_OD<0:7>.

The plurality of pipe latches 520a, . . . and 520b may output stored data according to the output control signals POUT_EV<0:7> and POUT_OD<0:7> which are enabled in conformity with predetermined timings.

Each of the plurality of pipe latches 520a, . . . and 520b may include a plurality of latches 521.

Latches 521 are disposed in such a manner that latches coupled with input/output signal lines of the same orders among the input/output signal lines GIO_EV<0:4> and GIO_OD<0:4> are distributed according to first orders (<0: 3>/<4:7>) of the input/output control signals PIN_EV<0:7>, PIN_OD<0:7>, POUT_EV<0:7> and POUT_OD<0:7> and are identified according to a second order (even/odd).

Among the latches 521 disposed by being distributed and identified in this way, latches matching in terms of the first orders (<0:3>/<4:7>) and the second order (even/odd) may configure the pipe latches 520a, . . . and 520b, which will be described below with reference to FIG. 7.

Figure 7:
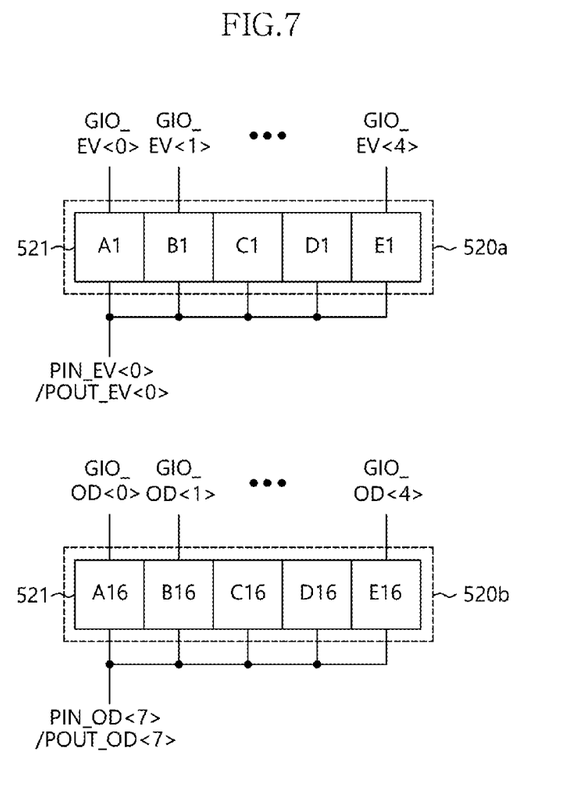
FIG. 7 is a diagram illustrating a representation of an example of the configurations of pipe latches illustrated in FIG. 6.

Referring to FIG. 7, the plurality of pipe latches 520a, . . . and 520b may be identified to independently process respective data of the even input/output signal lines GIO_EV<0:4> and the odd input/output signal lines GIO_OD<0:4> among the input/output signal lines GIO_EV<0:4> and GIO_OD<0:4>.

The latches 521 of the pipe latch 520a may be identified by symbols A1 to E1, and, while not illustrated, the latches of a pipe latch on the right side of the pipe latch 520a may be identified by symbols A2 to E2. In this way, the latches of the rightmost pipe latch 520b may be identified by symbols A16 to E16.

In the respective pipe latches, latches 521 given with the same alphabets may be coupled with input/output signal lines of the same orders among the input/output signal lines GIO_EV<0>/GIO_OD<0> to GIO_EV<4>/GIO_OD<4>, and latches 521 given with different alphabets may be coupled with input/output signal lines of different orders among the input/output signal lines GIO_EV<0>/GIO_OD<0> to GIO_EV<4>/GIO_OD<4>.

For example, the input/output signal line GIO_EV<0> may be coupled to the latches A1 to A8, and the input/output signal line GIO_OD<0> may be coupled to the latches A9 to A16.

Also, the input/output signal line GIO_EV<4> may be coupled to the latches E1 to E8, and the input/output signal line GIO_OD<4> may be coupled to the latches E9 to E16.

The even input/output control signals PIN_EV<0> and POUT_EV<0> matching in terms of the first orders (<0:3>/ <4:7>) and the second order (even/odd) may be inputted to the latches A1 to E1 of the pipe latch 520a.

The odd input/output control signals PIN_OD<7> and POUT_OD<7> matching in terms of the first orders (<0: 3>/<4:7>) and the second order (even/odd) may be inputted to the latches A16 to E16 of the pipe latch 520b.

As described above, the pipe latches 520a, . . . and 520b may be configured in such a manner that latches 521 coupled with input/output signal lines of the same orders are disposed by being distributed according to the first orders (<0:3>/<4:7>) of the input/output control signals PIN_EV<0:7>, PIN_OD<0:7>, POUT_EV<0:7> and POUT_OD<0:7> and being identified according to the second order (even/odd) and latches 521 matching in terms of the first orders (<0:3>/<4:7>) and the second order (even/odd) among the latches 521 disposed by being distributed and identified are grouped together.

Referring again to FIG. 6, the output selection block 601 may generate an output signal OUT by selecting data outputted from the plurality of pipe latches 520a, . . . and 520b, according to first to third selection control signals SELB1 to SELB3.

The output selection block 601 may primarily multiplex data outputted from the plurality of pipe latches 520a, . . . and 520b, according to orders (<0:3> or <4:7>) of the output control signals POUT_EV<0:7> and POUT_OD<0:7>, and output resultant data, and may secondarily multiplex primarily multiplexed data according to a order (even/odd) of the input/output signal lines GIO_EV<0>/GIO_OD<0> to GIO_EV<4>/GIO_OD<4> and output resultant data.

The output selection block 601 of FIG. 6 is illustrated as only a component for processing output data of the latches A1 to A16 coupled with the input/output signal lines GIO_EV<0> and GIO_OD<0> of the same order among the latches 521 of the plurality of pipe latches 520a, . . . and 520b, and components for processing output data of the remaining latches B1 to B16, C1 to C16, D1 to D16 and E1 to E16 may be configured in the same way as the output selection block 601.

The output selection block 601 may include a first multiplexer 611 to a third multiplexer 631.

The first multiplexer 611 may select and output, according to the first selection control signal SELB1, one among output data of the latches A1 to A4 from which data are outputted according to the even output control signals POUT_EV<0:3> and output data of the latches A5 to A8 from which data are outputted according to the even output control signals POUT_EV<4:7>.

The second multiplexer 621 may select and output, according to the second selection control signal SELB2, one among output data of the latches A9 to A12 from which data are outputted according to the odd output control signals POUT_OD<0:3> and output data of the latches A13 to A16 from which data are outputted according to the odd output control signals POUT_OD<4:7>.

The third multiplexer 631 may generate the output signal OUT by selecting one between the output signal of the first multiplexer 611 and the output signal of the second multiplexer 621 according to the third selection control signal SELB3.

The first to third selection control signals SELB1 to SELB3 may be generated based on the output control signals POUT_EV<0:7> and POUT_OD<0:7>.

For example, the first selection control signal SELB1 may be generated using one or more among the even output control signals POUT_EV<0:7>, for example, the even output control signals POUT_EV<0:3> or POUT_EV<4:7>.

The second selection control signal SELB2 may be generated using one or more among the odd output control signals POUT_OD<0:7>, for example, the odd output control signals POUT_OD<0:3> or POUT_OD<4:7>.

The third selection control signal SELB3 may be generated according to one or more among the output control signals POUT_EV<0:7> or one or more among the output control signals POUT_OD<0:7>.

The latch circuits or semiconductor apparatuses including a latch circuit as discussed above (see FIGS. 1-7) are particular useful in the design of memory devices, processors, and computer systems. For example, referring to FIG. 8, a block diagram of a system employing a latch circuit or semiconductor apparatus including a latch circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 8:
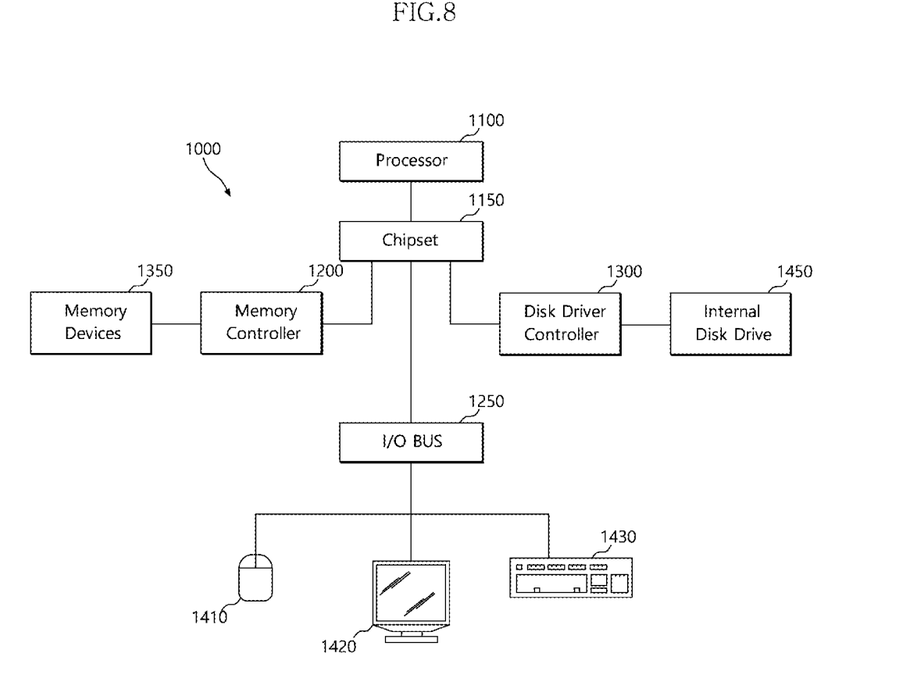
FIG. 8 illustrates a block diagram of an example of a representation of a system employing a latch circuit or semiconductor apparatus including a latch circuit with the various embodiments discussed above with relation to FIGS. 1-7.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one latch circuit or semiconductor apparatus including a latch circuit as discussed above with reference to FIGS. 1-7. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one latch circuit or semiconductor apparatus including a latch circuit as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 8 is merely one example of a system 1000 employing a latch circuit or semiconductor apparatus including a latch circuit as discussed above with relation to FIGS. 1-7. In alternate embodiments, such as, for example but not limited to, cellular phones or digital cameras, the components may differ from the embodiments illustrated in FIG. 8.

While various embodiments have been described above, it will be understood to those skilled in the art that the embodiments described are examples only. Accordingly, the latch circuit and the semiconductor apparatus including the same described herein should not be limited based on the described embodiments.

What is claimed is:

1. A latch circuit comprising:
   a plurality of pipe latches configured to store and output data through input/output signal lines according to input/output control signals,
   wherein the plurality of pipe latches are directly connected to with same input/output signal lines, and
   wherein the plurality of pipe latches are inputted with signals of different orders among the input/output control signals.

2. The latch circuit according to claim 1, wherein latches which configure the plurality of pipe latches are coupled with input/output signal lines of different orders among the input/output signal lines.

3. The latch circuit according to claim 1, further comprising:
   an output selection block configured to primarily multiplex data outputted from the plurality of pipe latches, according to first order of output control signals among the input/output control signals, and output resultant data, and secondarily multiplex primarily multiplexed data according to a second order of the output control signals and output resultant data.

4. The latch circuit according to claim 3, wherein the output selection block comprises:
   a first multiplexer configured to select and output, according to a first selection control signal, one among output data of latches from which data are outputted according to some among even output control signals and output data of latches from which data are outputted according to remainders among the even output control signals;
   a second multiplexer configured to select and output, according to a second selection control signal, one among output data of latches from which data are outputted according to some among odd output control signals and output data of latches from which data are outputted according to remainders among the odd output control signals; and
   a third multiplexer configured to generate an output signal by selecting one between an output signal of the first multiplexer and an output signal of the second multiplexer according to a third selection control signal.

5. A latch circuit comprising:
   a plurality of pipe latches configured to store and output data through input/output signal lines according to input/output control signals,
   wherein some of the plurality of pipe latches are directly connected to signal lines of even orders among the input/output signal lines, and remainders of the plurality of pipe latches are directly connected to signal lines of odd orders among the input/output signal lines, and
   wherein the some of the plurality of pipe latches are inputted with signals of different orders among the input/output control signals.

6. The latch circuit according to claim 5, wherein latches which configure the plurality of pipe latches are coupled with input/output signal lines of different orders among the input/output signal lines.

7. The latch circuit according to claim 5, further comprising:
   an output selection block configured to primarily multiplex data outputted from the plurality of pipe latches, according to an order of output control signals among the input/output control signals, and output resultant data, and secondarily multiplex primarily multiplexed data according to an order of the input/output signal lines and output resultant data.

8. The latch circuit according to claim 7, wherein the output selection block comprises:
   a first multiplexer configured to select and output, according to a first selection control signal, one among output data of latches from which data are outputted according to some among even output control signals and output data of latches from which data are outputted according to remainders among the even output control signals;
   a second multiplexer configured to select and output, according to a second selection control signal, one among output data of latches from which data are outputted according to some among odd output control signals and output data of latches from which data are outputted according to remainders among the odd output control signals; and
   a third multiplexer configured to generate an output signal by selecting one between an output signal of the first multiplexer and an output signal of the second multiplexer according to a third selection control signal.

9. A semiconductor apparatus comprising:
   a semiconductor memory in which a plurality of memory chips are stacked,
   at least one among the memory chips comprising:
   a through electrode region where a plurality of through electrodes are disposed, and
   a latch circuit disposed in the through electrode region,
   wherein the latch circuit comprises a plurality of pipe latches, and the plurality of pipe latches are directly connected to input/output signal lines, and
   wherein the plurality of pipe latches are inputted with signals of different orders among input/output control signals.

10. The semiconductor apparatus according to claim 9, wherein latches which configure the plurality of pipe latches are coupled with signal lines of different orders among the input/output signal lines.

11. The semiconductor apparatus according to claim 9, wherein the latch circuit comprises an output selection block configured to primarily multiplex data outputted from the plurality of pipe latches, according to first order of output control signals among the input/output control signals, and output resultant data, and secondarily multiplex primarily multiplexed data according to a second order of the output control signals and output resultant data.

12. The semiconductor apparatus according to claim 11, wherein the output selection block comprises:
   a first multiplexer configured to select and output, according to a first selection control signal, one among output data of latches from which data are outputted according to some among even output control signals and output data of latches from which data are outputted according to remainders among the even output control signals;
   a second multiplexer configured to select and output, according to a second selection control signal, one among output data of latches from which data are outputted according to some among odd output control signals and output data of latches from which data are outputted according to remainders among the odd output control signals; and
   a third multiplexer configured to generate an output signal by selecting one between an output signal of the first multiplexer and an output signal of the second multiplexer according to a third selection control signal.

13. The semiconductor apparatus according to claim 9, wherein some of the plurality of pipe latches are coupled with signal lines of even orders among the input/output signal lines in common, and remainders of the plurality of pipe latches are coupled with signal lines of odd orders among the input/output signal lines in common, and wherein the some of the plurality of pipe latches are inputted with signals of different orders among the input/output control signals.

14. The semiconductor apparatus according to claim 9, wherein the latch circuit comprises an output selection block configured to primarily multiplex data outputted from the plurality of pipe latches, according to an order of output control signals among the input/output control signals, and output resultant data, and secondarily multiplex primarily multiplexed data according to an order of the input/output signal lines and output resultant data.

15. The semiconductor apparatus according to claim 14, wherein the output selection block comprises:

a first multiplexer configured to select and output, according to a first selection control signal, one among output data of latches from which data are outputted according to some among even output control signals and output data of latches from which data are outputted according to remainders among the even output control signals;

a second multiplexer configured to select and output, according to a second selection control signal, one among output data of latches from which data are outputted according to some among odd output control signals and output data of latches from which data are outputted according to remainders among the odd output control signals; and a third multiplexer configured to generate an output signal by selecting one between an output signal of the first multiplexer and an output signal of the second multiplexer according to a third selection control signal.

16. The semiconductor apparatus according to claim 9, wherein the plurality of memory chips include a base die and core dies stacked over the base die, and wherein the latch circuit is disposed in the through electrode region of a core die.

* * * * *